United States Patent
Wu et al.

(10) Patent No.: US 10,707,854 B2
(45) Date of Patent: *Jul. 7, 2020

(54) CLOCK SCREENING WITH PROGRAMMABLE COUNTER-BASED CLOCK INTERFACE AND TIME-TO-DIGITAL CONVERTER WITH HIGH RESOLUTION AND WIDE RANGE OPERATION

(71) Applicant: QUALCOMM Incorporated, San Diego, CA (US)

(72) Inventors: Zhengzheng Wu, Santa Clara, CA (US); Deping Huang, Cupertino, CA (US); Jeffrey Mark Hinrichs, San Diego, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/684,421

(22) Filed: Nov. 14, 2019

(65) Prior Publication Data

US 2020/0083873 A1 Mar. 12, 2020

Related U.S. Application Data

(63) Continuation of application No. 15/904,124, filed on Feb. 23, 2018, now Pat. No. 10,520,901.

(51) Int. Cl.
*G04F 10/04* (2006.01)
*H03K 5/26* (2006.01)
*H03L 7/099* (2006.01)
*H03L 7/14* (2006.01)
*H03L 7/187* (2006.01)
*H03L 7/191* (2006.01)
*G04F 10/00* (2006.01)

(52) U.S. Cl.
CPC ............. *H03K 5/26* (2013.01); *G04F 10/005* (2013.01); *G04F 10/04* (2013.01); *H03L 7/0996* (2013.01); *H03L 7/141* (2013.01); *H03L 7/187* (2013.01); *H03L 7/191* (2013.01)

(58) Field of Classification Search
CPC ....... G01R 25/08; G04F 10/00; G04F 10/005; G04F 10/04; H03K 5/26
See application file for complete search history.

(56) References Cited

U.S. PATENT DOCUMENTS

| | | | |
|---|---|---|---|
| 4,072,910 A * | 2/1978 | Dingwall | H03K 4/06 331/108 B |
| 4,164,648 A | 8/1979 | Chu | |
| 5,568,071 A | 10/1996 | Hoshino et al. | |
| 6,295,315 B1 | 9/2001 | Frisch et al. | |
| 9,379,714 B1 | 6/2016 | Xiu | |

(Continued)

OTHER PUBLICATIONS

International Search Report and Written Opinion—PCT/US2019/014856—ISA/EPO—dated Sep. 27, 2019.

(Continued)

*Primary Examiner* — Levi Gannon
(74) *Attorney, Agent, or Firm* — Qualcomm Incorporated (57) ABSTRACT

A sub-ranging time-to-digital converter (TDC) is disclosed that includes two ring oscillators for determining a time difference between two clock edges.

17 Claims, 11 Drawing Sheets

(56) References Cited

U.S. PATENT DOCUMENTS

| | | |
|---|---|---|
| 9,479,150 B1 | 10/2016 | Lin |
| 2003/0098731 A1 | 5/2003 | Tabatabaei et al. |
| 2008/0191921 A1 | 8/2008 | Scholz et al. |
| 2010/0134165 A1 | 6/2010 | Oh et al. |
| 2012/0092052 A1 | 4/2012 | Matsuda |
| 2015/0145572 A1 | 5/2015 | Sato |
| 2016/0248414 A1* | 8/2016 | Vilangudipitchai ............... H03K 17/04206 |
| 2018/0175838 A1 | 6/2018 | Hashimoto |
| 2018/0267480 A1* | 9/2018 | Mahajan .................. G06F 1/12 |
| 2019/0056274 A1* | 2/2019 | Fan ..................... H03K 3/0315 |
| 2019/0064747 A1 | 2/2019 | Sudo et al. |
| 2019/0064748 A1 | 2/2019 | Haneda |
| 2019/0064749 A1 | 2/2019 | Sudo |
| 2019/0268010 A1 | 8/2019 | Wu et al. |

OTHER PUBLICATIONS

Partial International Search Report—PCT/US2019/014856—ISA/EPO—dated Jul. 29, 2019.

Prasad K.H., et al., "FPGA based Time-to-Digital Converter", Proceedings of the DAE Symp. on Nucl. Phys, Jan. 1, 2011 (Jan. 1, 2011), XP055604775, Retrieved from the Internet: URL:https://pdfs.semanticscholar.org/d784/ed9d4538b731663990131568e3fbc4cb96ee.pdf ,p. 1044-p. 1045, left-hand column; figures 1-3.

Sorkhabi M.M., et al., "A High Resolution First Order Noise-Shaping Vernier Time-to-Digital Converter", American Journal of Electrical and Electronic Engineering, vol. 1, No. 2, May 1, 2013 (May 1, 2013), pp. 19-22, XP055604767, ISSN: 2328-7365, DOI: 10.12691/ajeee-1-2-1, p. 19, paragraph 1, p. 20, paragraph 3; figure 2, p. 21, paragraph 4; figures 3,4.

* cited by examiner

CLOCK SCREENING WITH PROGRAMMABLE COUNTER-BASED CLOCK INTERFACE AND TIME-TO-DIGITAL CONVERTER WITH HIGH RESOLUTION AND WIDE RANGE OPERATION

CROSS REFERENCE TO RELATED APPLICATIONS

The present application is a continuation application of U.S. Non-Provisional patent application Ser. No. 15/904,124, filed Feb. 23, 2018, which is hereby incorporated by reference in its entirety.

TECHNICAL FIELD

This application relates to clock measurement, and more particularly to a sub-ranging time-to-digital clock measurement.

BACKGROUND

Modern devices such as smartphones and tablets demand stringent clock performance standards for their various sub-systems such as digital cores, data converters, and frequency synthesizers. For example, clock performance for digital cores must satisfy low period jitter and low duty-cycle error. Similarly, data converters require clock signals with low absolute jitter (time internal error (TIE)). In addition, frequency synthesizers require clock signals with low phase noise and reduced fractional spurs. Emerging self-driving automotive applications also demand stringent clock performance.

To ensure that such demanding clock performance standards are maintained, it is conventional for modern devices to incorporate on-chip clock screening for automatic or on-the-fly monitoring purposes. But conventional clock screening techniques are not able to address all of the various clock measurement modes such as period jitter, K-cycle jitter, TIE jitter, duty-cycle variation, clock skew, and so on. One problem that has thwarted conventional approaches to offer a unified clock performance circuit is that such a generic clock performance screening simultaneously requires high resolution, wide input frequency range, and high robustness. To attempt to meet such divergent requirements, existing designs typically employ delay cells to implement a time-to-digital (TDC) converter for clock jitter and clock skew measurement. But satisfying high resolution and wide input frequency range requires numerous delay cells using conventional flash TDC or Vernier TDC architectures, which consumes substantial chip area and increases power consumption. Moreover, such a plurality of delay cells is prone to process variations so as to lower testing robustness and produce false clock screening results.

There is thus a need in the art for a clock screening circuit that includes a time-to-digital converter that is insensitive to process variations and also includes a clock interface that supports multiple modes for screening various clock performance metrics.

SUMMARY

To provide increased accuracy and frequency input range, a sub-ranging time-to-digital converter (TDC) is disclosed that measures the time difference between a first clock edge for a clock signal and a second edge using a fine count and a coarse count. The TDC includes a slow oscillator that begins oscillating a slow oscillator output signal responsive to the first clock edge. A coarse counter counts the coarse count responsive to the slow oscillator output signal. The TDC also includes a fast oscillator that begins oscillating a fast oscillator output signal responsive to the second clock edge, which may arrive either later or earlier than the first clock edge. A fine counter counts the fine count responsive to the fast oscillator output signal. The TDC may be integrated into a clock measurement circuit that enables a wide variety of clock measurements such as period jitter measurement, K-cycle jitter measurement, duty cycle measurement, time internal error (TIE) measurement, and clock skew measurement. These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
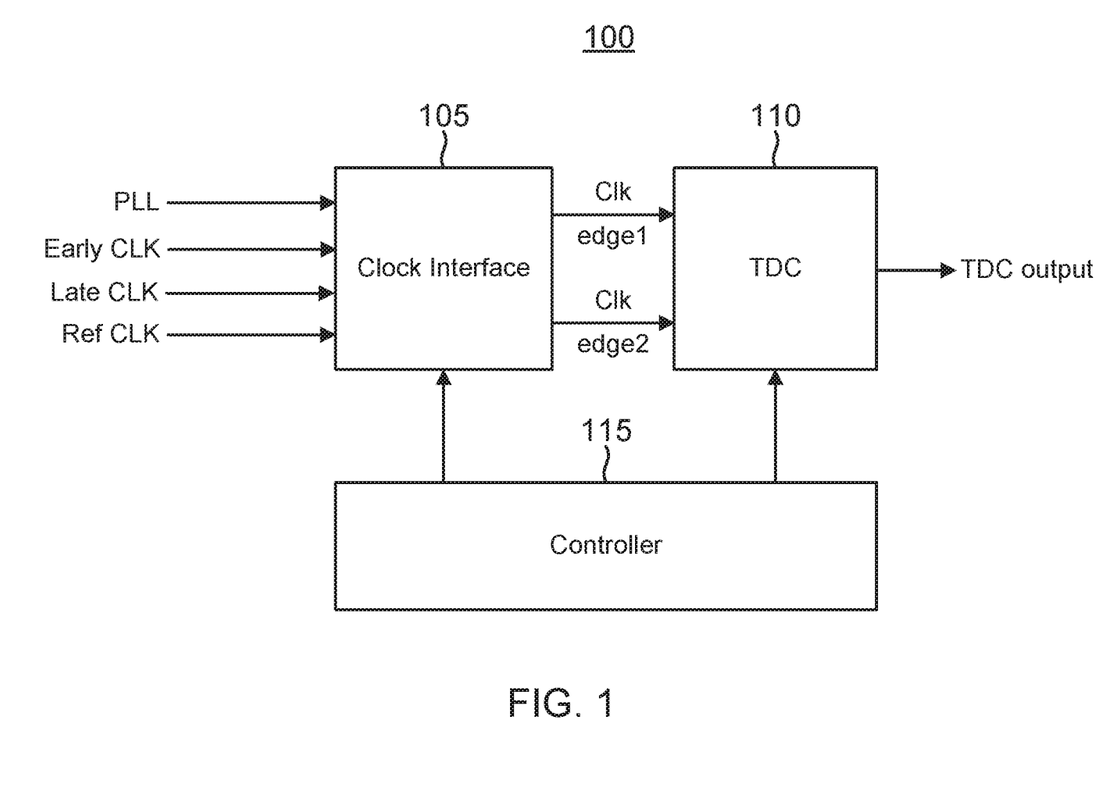
FIG. 1 is a block diagram of a clock measurement circuit in accordance with an aspect of the disclosure.

Turning now to the drawings, a clock measurement circuit 100 (which may also be denoted as a built-in-self-test (BIST) circuit) is shown in FIG. 1. Clock measurement circuit 100 includes a clock interface 105 that supports multiple clock screening modes of operation such as period jitter measurement, K-cycle jitter measurement, duty cycle measurement, clock skew, and time internal error (TIE) measurement. Clock interface 105 is quite advantageous in that the conventional need for multiple clock measurement circuits to service such diverse clock testing modes is obviated. Depending upon the measurement mode, clock interface 105 will select two clock edges from one or more input clock signals. For example, clock interface 105 may select for a phase-locked loop (PLL) clock signal to perform the period jitter measurement, the duty cycle measurement, and the K-cycle jitter measurement as will be explained further herein. It will be appreciated that the PLL clock signal may be replaced by other clock signals being measured such as a delay-locked loop (DLL) clock signal or other suitable clock sources. In a clock skew measurement, clock interface 105 selects for a first clock edge of a clock signal such as received from a clock-tree output node and also for a second clock edge of another clock signal such as received from another clock-tree output node. Either the first clock edge or the second clock edge may be earlier than the remaining one of the first and second clock edges. The resulting time-to-digital measurement may thus measure either a positive or negative time difference between the two clock edges depending upon whether the first clock edge is earlier or later than the second clock edge. To perform a TIE measurement, clock interface 105 selects for an edge of a clock signal such as the PLL clock signal and also for an edge of a reference clock signal (Ref CLK) such as a crystal oscillator signal.

One of the clock edges selected by clock interface 105 will be leading the remaining selected clock edge. The delay between these two selected clock edges is measured by a time-to-digital converter (TDC) 110. As will be explained further herein, TDC 110 is formed using a sub-ranging architecture that includes a pair of ring oscillators (not shown in FIG. 1) that each include as few as three inverters. TDC 110 thus is compact yet achieves high resolution across a wide input range of frequencies. A controller 115 controls clock interface 105 and TDC 110 as well as their interaction. The output of TDC 110 is a digital number corresponding to the measurement of the delay between the two clock edges. The processing of such a digital number into the various clock measurements is known to those of ordinary skill in the clock measurement arts and thus will not be discussed herein. But it will be appreciated that a post-processing controller (not illustrated) would receive the digital output from TDC 110 and process it into the desired measurement result such as clock skew, period jitter, and so on.

Figure 2A:
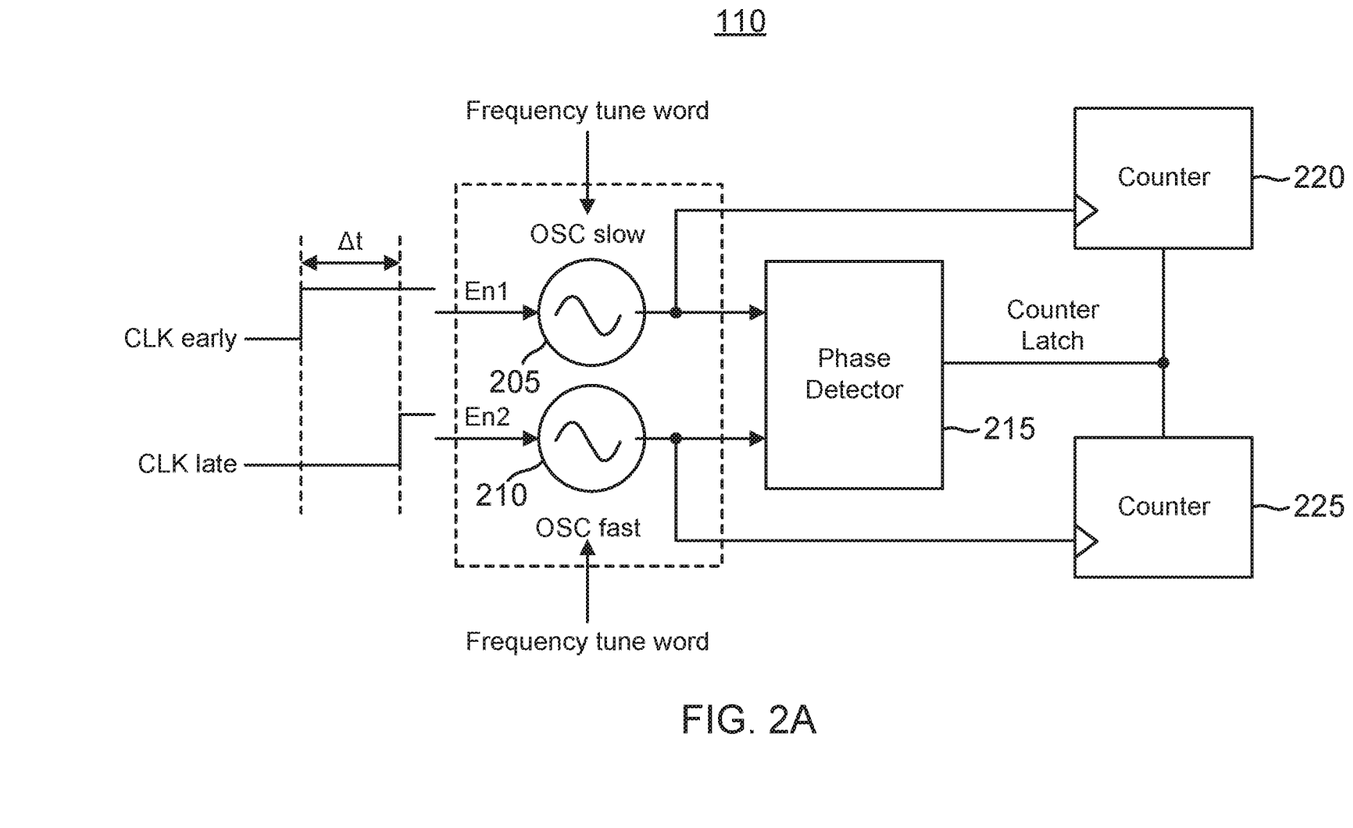
FIG. 2A is a circuit diagram for a time-to-digital converter (TDC) in accordance with an aspect of the disclosure.

TDC 110 is shown in more detail in FIG. 2A. As discussed above, clock interface 105 of FIG. 1 has selected two clock edges from its received clock signals depending upon the desired clock measurement. The type of clock edge (rising or falling) also depends upon the desired clock measurement. For example, a period jitter measurement or a K-cycle jitter measurement may involve the selection of two rising clock edges such as shown in FIG. 2A. Alternatively, two falling clock edges may be selected for such measurements. The selected clock signal edge that is leading the remaining selected clock edge is denoted in FIGS. 1 and 2A as the CLK early signal whereas the lagging selected clock signal edge is denoted as CLK late. The rising edge for the CLK early signal triggers a slow oscillator 205 to begin oscillating such as in response to the assertion of an enable signal En1 at the time of the rising edge. As implied by its name, slow oscillator 205 oscillates more slowly as compared to a fast oscillator 210 that is triggered to oscillate by the rising edge of the CLK late signal such as through the corresponding assertion of an enable signal En2. Depending upon the delay ($\Delta t$) between the CLK early and CLK late edges, slow oscillator 205 will oscillate a slow oscillator output signal a certain number of oscillation periods prior to the triggering of fast oscillator 210 to oscillate its fast oscillator output signal.

The slow oscillator output signal clocks a coarse counter 220 to begin counting cycles of the slow oscillator output signal whereas the fast oscillator output signal clocks a fine counter 225 to begin counting cycles of the fast oscillator output signal. When fast oscillator 210 begins oscillating, a first cycle of the fast oscillator output signal will typically be lagging in phase as compared to the slow oscillator output signal from slow oscillator 205. It will then take a certain number of oscillation periods for the fast oscillator output signal before the slow oscillator output signal is lagging the fast oscillator output signal. Phase detector 215 detects when the fast oscillator output signal catches up in phase and begins leading the slow oscillator output signal and triggers coarse counter 220 and fine counter 225 to latch their count. The latched count for fine counter 225 may be designated as Nfine.

Figure 2B:
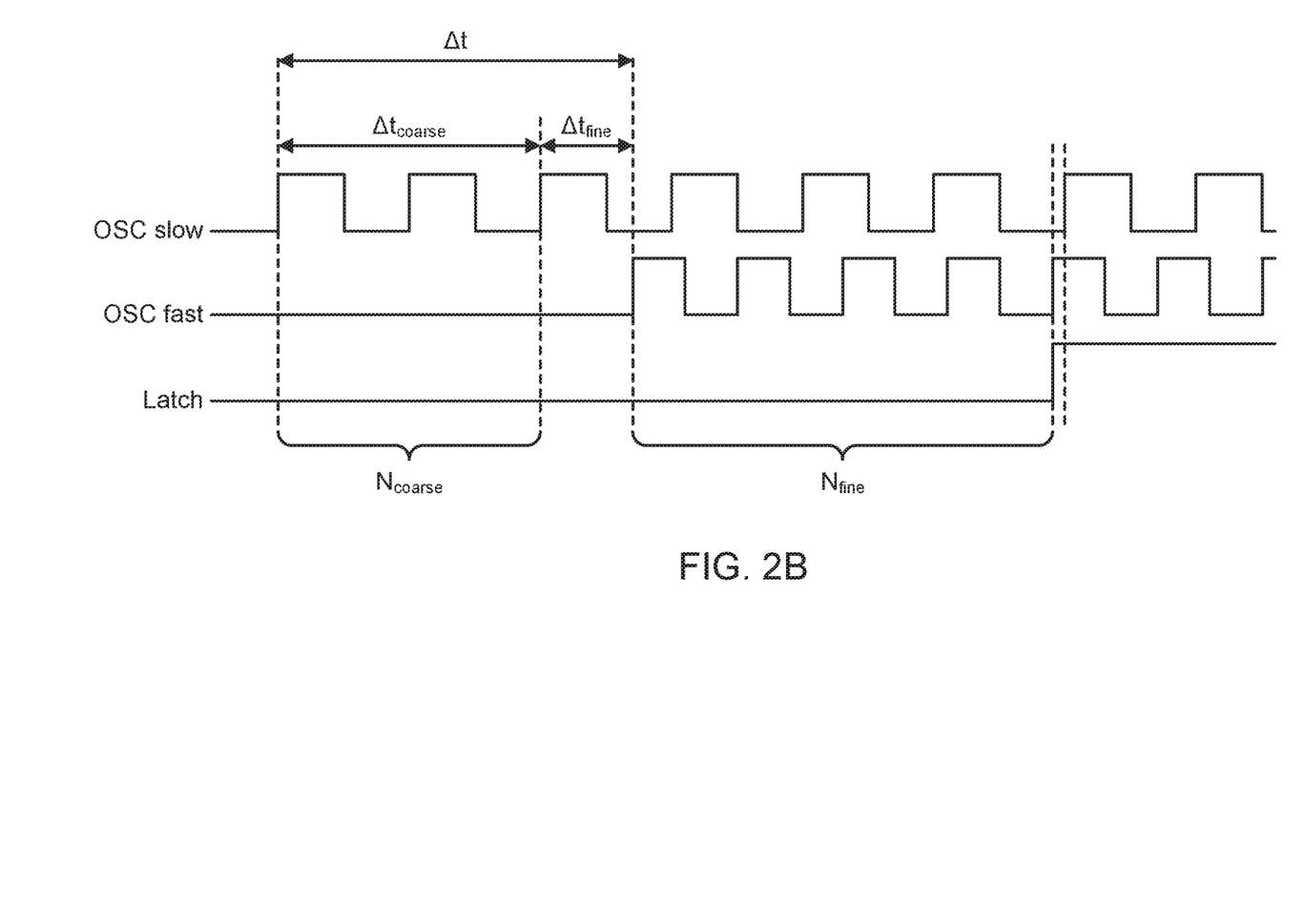
FIG. 2B is a timing diagram for a slow oscillator output signal, a fast oscillator output signal, and a latch command for the TDC of FIG. 2A.

An example timing diagram for the slow oscillator output signal (designated as OSC slow) and for the fast oscillator output signal (designated as OSC fast) is shown in FIG. 2B. The delay $\Delta t$ between the CLK early and CLK late signals (FIG. 2A) equals a sum of a coarse delay ($\Delta t coarse$) and a fine delay ($\Delta t fine$). To distinguish between the periods for the slow and fast oscillator signals, the period for the slow oscillator output signal is denoted herein as Tslow whereas the period for the fast oscillator output signal is denoted herein as Tfast. In FIG. 2B, the slow oscillator output signal oscillates through two Tslow periods plus a fraction of another Tslow period before the rising edge of the fast oscillator output signal. The total delay $\Delta t$ equals the two Tslow periods plus this additional fraction of the Tslow period. A coarse count Ncoarse equals the integer number of Tslow periods between the CLK early and CLK late edges. It can thus be shown that the delay $\Delta t$ equals the Ncoarse*Tslow+Nfine*(Tslow−Tfast). Note that coarse counter 220 may be latched responsive to the CLK late edge in alternative implementations. In such an implementation, Ncoarse would equal the count latched by coarse counter 220. Should coarse counter 220 be latched in common with fine counter 215 as shown in FIG. 2B, TDC 110 may adjust the count latched by coarse counter 220 accordingly to obtain Ncoarse. If the delay $\Delta t$ processed by TDC 110 is negative, fast oscillator 210 will start earlier than slow oscillator 205. The counts from coarse counter 220 and fine counter 225 can then be collected in similar way as shown in FIG. 2B to resolve a negative time-difference value with respect to TDC input $\Delta t$. Using the counter latch method of FIG. 2B, the sign of a difference between counter 220 and counter 225 after latching indicates the polarity of input $\Delta t$.

A desired ratio between Tslow and Tfast may be calibrated by controller 115 prior to the clock measurements such as through comparison to the reference clock signal. For example, controller 115 may count the number of oscillation cycles for slow oscillator 205 and fast oscillator 210 in one or more reference clock cycles. Controller 115 would then adjust a frequency tune word for slow oscillator 205 and/or a frequency tune word for fast oscillator 210 to enforce the desired relationship between Tslow and Tfast as well as their absolute values.

Figure 3:
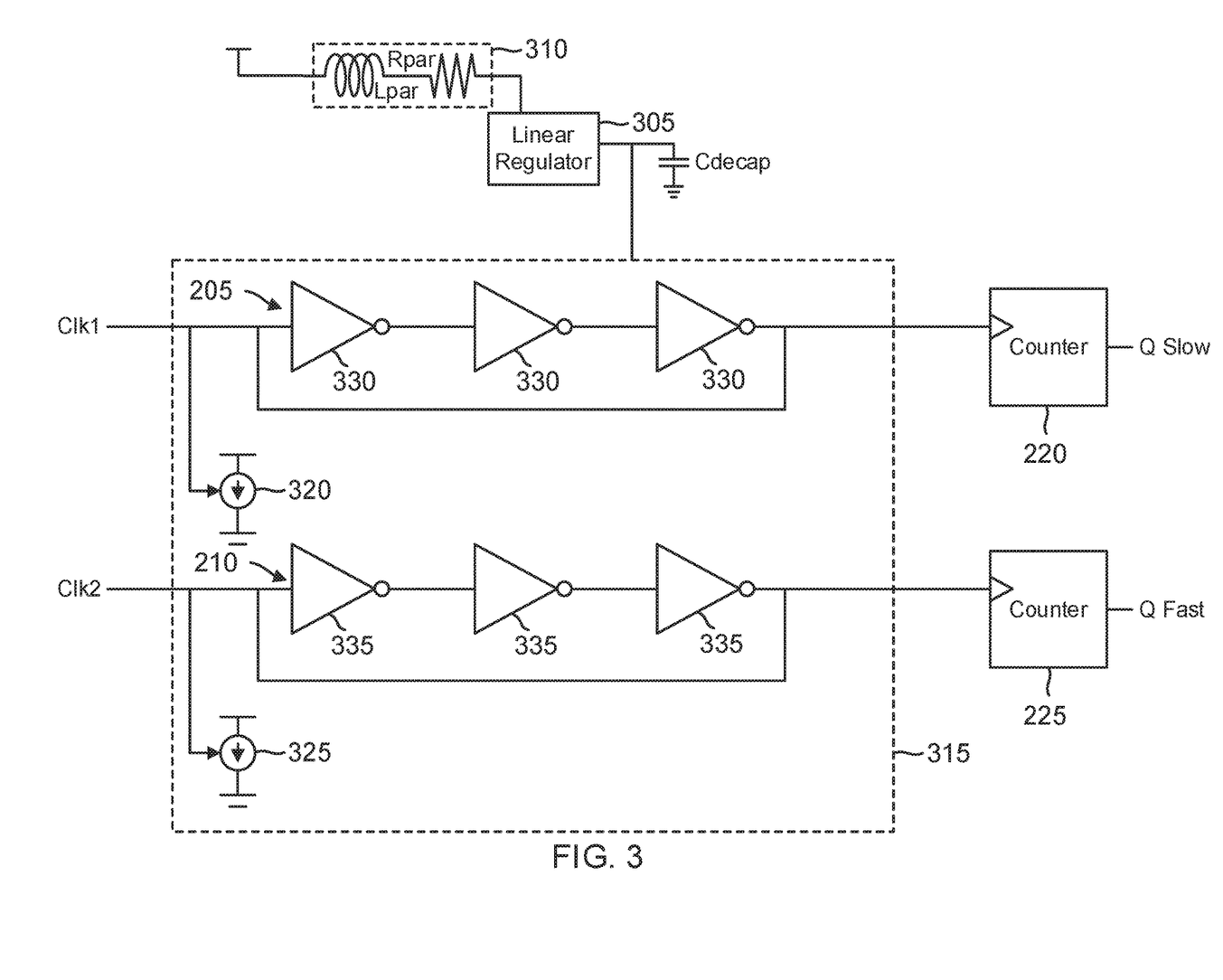
FIG. 3 is a circuit diagram for a stable power supply architecture for the TDC of FIG. 2A.

The time measurement by TDC 110 should be robust to voltage variations for its power supply voltage. The variations from chip power supply or from current drawn by slow oscillator 205 and fast oscillator 210 may cause the power supply voltage for TDC 110 to fluctuate, which affects the accuracy of the desired clock measurement. A robust power supply scheme for TDC 110 is shown in FIG. 3. An oscillator power domain 315 powers slow oscillator 205 and fast oscillator 210 based upon an oscillator power supply voltage Vreg_out from a linear regulator 305 as isolated from the chip power supply and smoothed through a decoupling capacitor Cdecap. Linear regulator 305 converts its own regulator power supply voltage Vdd_IP to supply and regulate oscillator power supply voltage Vreg_out. But the regulator power supply voltage Vdd_IP is subject to package and chip parasitics 310 as represented by a parasitic inductance Lpar and a parasitic capacitance Rpar. To prevent package and chip parasitics 310 from causing oscillator power supply voltage Vreg_out to sag when slow oscillator 205 and fast oscillator 210 begin oscillating, oscillator power domain 315 includes dummy current source loads 320 and 315. Dummy current source load 320 is configured to draw the same current as drawn by slow oscillator 205. Note that slow oscillator 205 may include as few as three inverters 330 arranged to form a ring oscillator. This is quite advantageous as compared to the typically much larger number of delay circuits required by conventional TDC designs. Similarly, fast oscillator 210 is formed using three inverters 335 arranged to form a ring oscillator. Dummy current source load 325 is configured to draw the same current as drawn by fast oscillator 210.

As discussed with regard to FIG. 2. TDC 110 measures the time delay Δt between two clock edges. The two clock edges are denoted as Clk1 and Clk2 in FIG. 3. For illustration clarity, these two clock edges are shown in FIG. 3 as directly driving their corresponding oscillator (fast or slow) without the intermediary enabling signals En1 and En2 discussed with regard to FIG. 2. The rising edge for the Clk1 signal causes slow oscillator 205 to begin oscillating and drawing its operating current. Prior to the arrival of this rising edge, dummy current source load 320 sinks a replica of this operating current. Dummy current source load 320 is configured to stop sinking this replica operating current in response to the rising edge of the Clk1 signal. The triggering of slow oscillator 205 will thus not perturb the oscillator power supply voltage as there is no sudden current demand caused by the triggering of slow oscillator 205. Similarly, dummy current source load 235 sinks a replica of an operating current that will be drawn by fast oscillator 210 and is configured to stop sinking this replica operating current responsive to the rising edge for the Clk2 signal. The triggering of fast oscillator 210 will thus also not cause a sudden current demand that could perturb the oscillator power supply voltage Vreg_out. In this fashion, the clock measurements described herein may be robust to power supply voltage variations such as caused by package and chip parasitics 310.

Figure 4A:
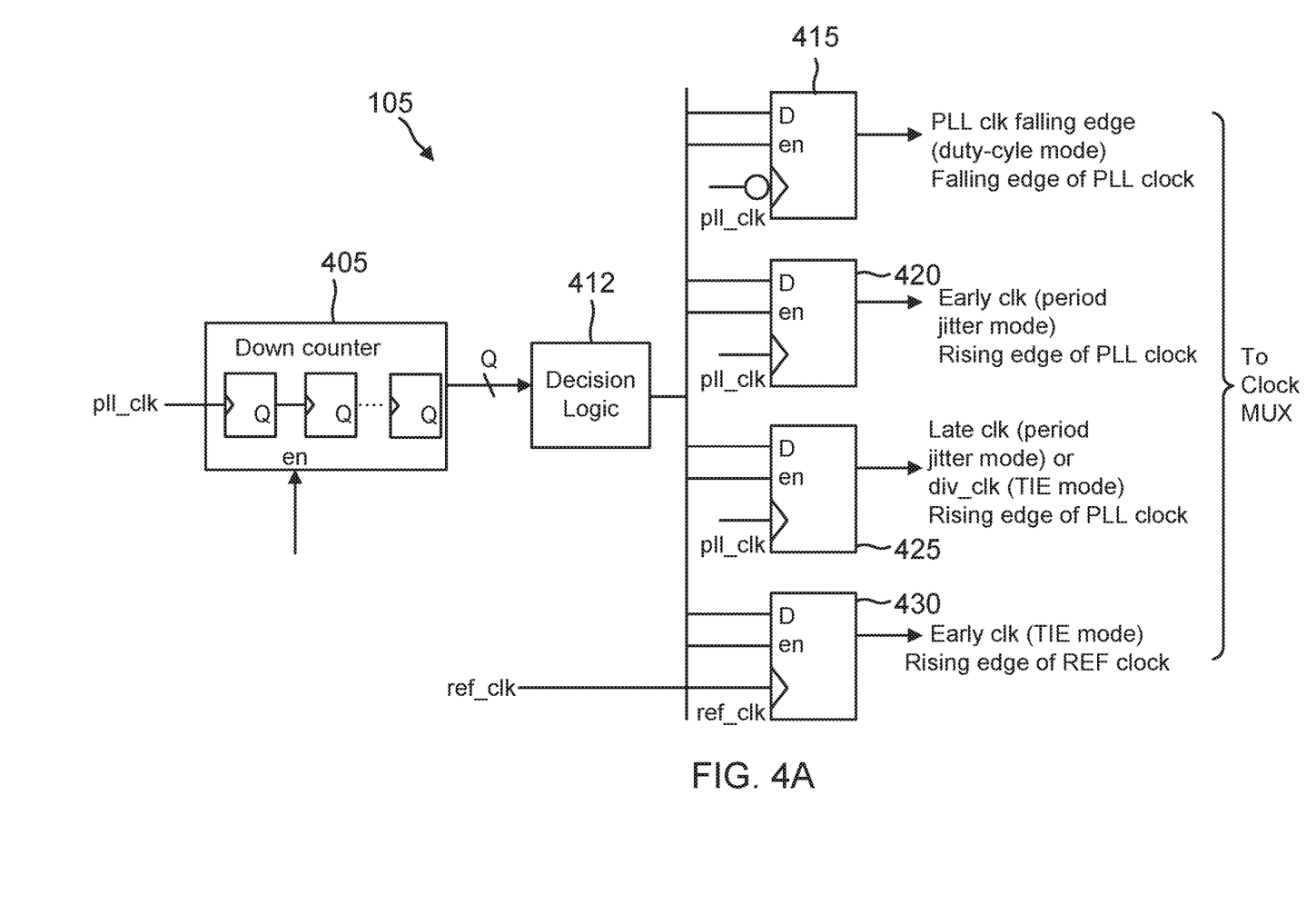
FIG. 4A is a circuit diagram for a clock interface circuit in accordance with an aspect of the disclosure.

Clock interface 105 is shown in more detail in FIG. 4A. A down counter 405 responds to an enable signal by updating a Q signal bus (typically a counter signal represented in binary) as clocked by a selected clock signal. As discussed with regard to FIG. 1, clock interface 105 may select from a plurality of clock signals depending upon the clock measurement mode. For example, clock interface 105 may include a clock multiplexer (not illustrated) that selects for the appropriate clock signal to clock the flip-flops in down counter 405. In a K-cycle jitter measurement, clock edges K cycles apart are tracked by down counter 405 and detected by a decision logic circuit 412 to be selected so that the time delay Δt between them may be measured by TDC 110. A series of K flip-flops within down counter 405 form a binary counter with the Q signal bus reporting the count value responsive to the selected clock signal. Decision logic circuit 412 detects the Q signal and asserts enable and D input signals to a flip-flop 420 and to a flip-flop 425 so as to generate clock edges K cycles apart. This process repeats itself periodically as down counter 405 is set to rollover and run continuously. In FIG. 4A, it is assumed that the PLL clock signal (pll_clk) is selected for by the clock multiplexer so that down counter 405 is clocked by the PLL clock signal but it will be appreciated that the selected clock signal may differ in alternative implementations depending upon the clock measurement mode.

In addition to flip-flops 420 and 425, decision logic circuit 412 may assert an enable signal to an output flip-flop 415 and to an output flip-flop 430. The enablement of a given one of these flip-flops depends upon the clock measurement. For example, in a duty cycle measurement of the PLL clock signal, decision logic 412 would enable output flip-flops 415 and 420. Output flip-flop 420 is clocked by the rising edge of the PLL clock signal. In such a duty cycle measurement, down counter 405 may be bypassed or it may be included with only one of its flip-flops being selected. Output flip-flop 420 will thus register a binary one value responsive to the rising edge of the PLL clock signal. TDC 110 (FIG. 1) receives the asserted output from output flip-flow 420 as the first clock edge. Output flip-flop 415 is clocked by the falling edge of the PLL clock signal so output flip-flop 415 will assert its output responsive to a falling edge of the PLL clock signal that occurs following the rising edge that clocked output flip-flop 420. TDC 110 receives the asserted output from output flip-flop 415 as the second clock edge. In such a duty cycle measurement, the delay ΔT between the two clock edges equals the on-time or pulse width for the PLL output clock signal. The duty cycle measurement is completed by forming a ratio of the pulse width and the period for the PLL clock signal.

Figure 4B:
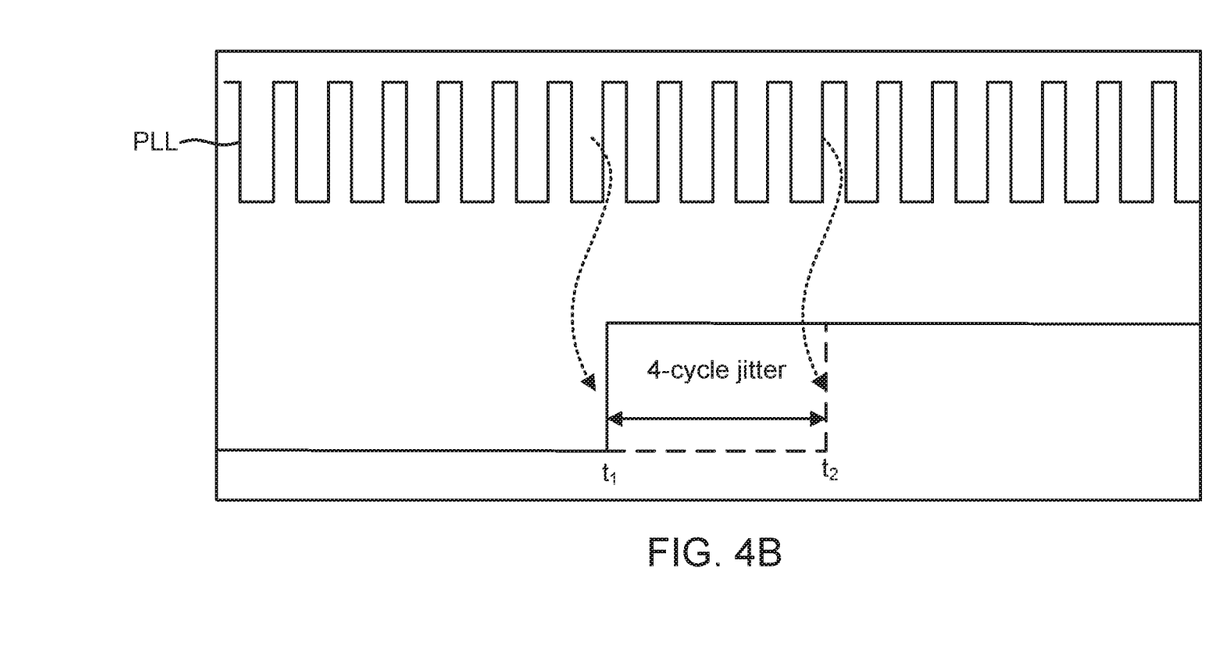
FIG. 4B is a timing diagram for a PLL clock signal and two clock edges selected from the PLL clock signal by the clock interface circuit of FIG. 4B.

In a jitter measurement (either a period or a K-cycle period jitter measurement), output flip-flop 420 is triggered by a first edge of the selected clock signal. In a K-cycle period jitter measurement, down counter 405 and decision logic circuit 412 may select for the rising edge K cycles after the assertion by output flip-flop 420. For example, as shown in the timing diagram of FIG. 4B, the rising edge for the PLL clock signal at a time t1 may trigger output flip-flop 420. The delay controlled by down counter 405 and decision logic circuit 412 in a K-cycle jitter measurement depends upon the integer K number of clock periods. In a K=4 K-cycle measurement, down counter 405 is configured to select the rising edge at a time t2 four clock periods after time t1. TDC 110 would then measure the delay between times t1 and t2 to perform such a K-cycle jitter measurement. In contrast, output flip-flop 425 would be enabled to capture the first rising edge following time t in a period jitter measurement. In a TIE measurement mode, the reference clock signal (ref_clk) clocks output flip-flop 430 to capture the rising edge of the reference clock signal. Output flip-flop 425 would then capture the appropriate edge of the PLL clock signal to complete the selection of the two clock edges for TDC 110 in a TIE measurement. Analogous output flip-flops (not illustrated) would be enabled to capture the appropriate edges in a clock skew measurement. It will thus be appreciated that output flip-flops 415 through 430 are merely representative of the output flip-flops that may be included in clock interface 105. An output clock multiplexer (not illustrated) would then select for the output signals from the appropriate output flip-flops to present the two selected clock edges to TDC 110.

Figure 5A:
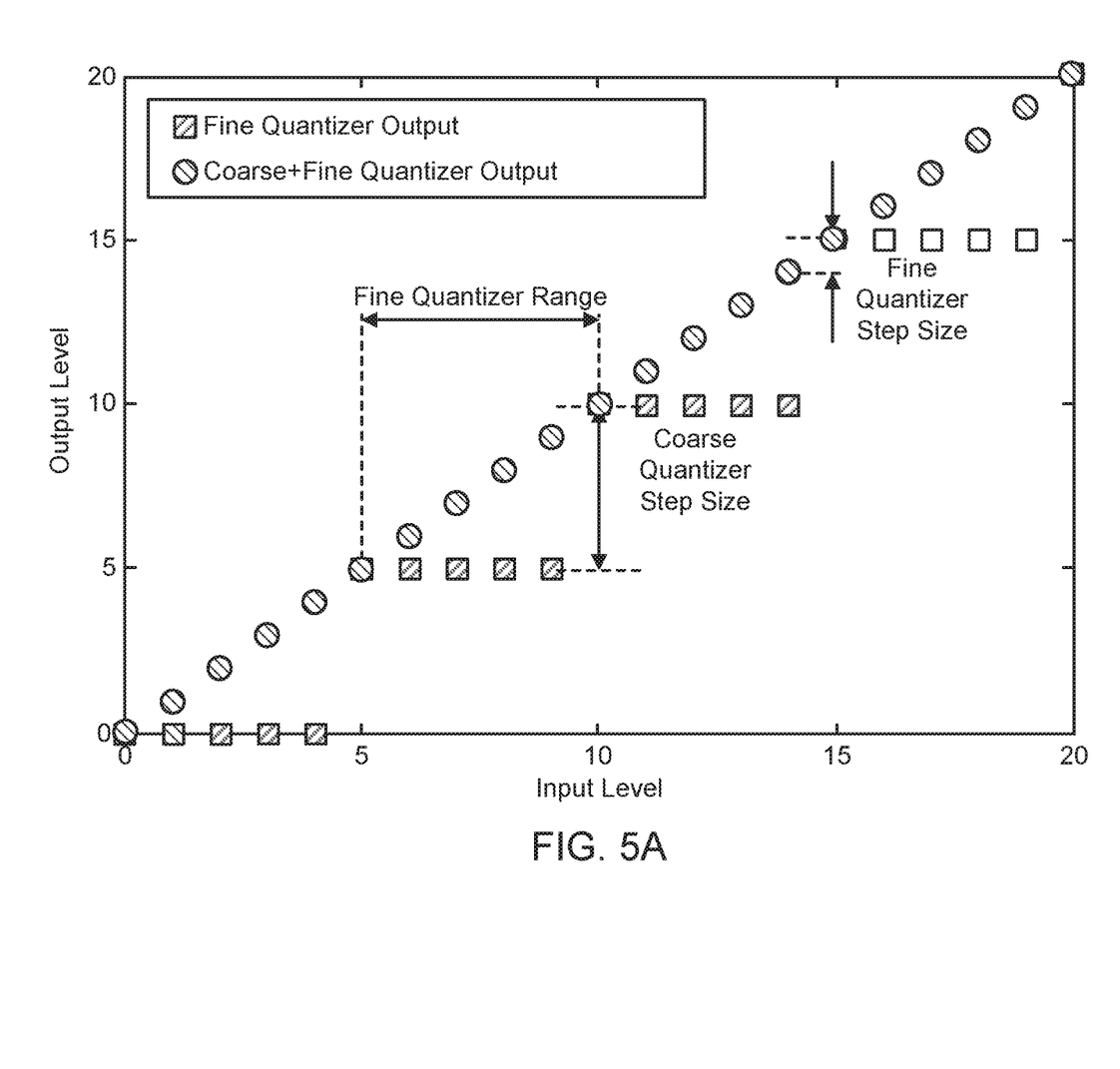
FIG. 5A is a graph of an ideal TDC output as a function of the TDC input.

The sub-ranging measurement by TDC 110 solves the conflicting prior art problems of providing increased resolution over a wide input frequency range while maintaining a compact area and low circuit complexity. But the accuracy of its measurement depends upon the appropriate relationship between the periods of fast oscillator 210, the periods of the slow oscillator 205, and TDC input patterns. An ideal relationship results in a linear relationship between the input and output of TDC 110 as shown in FIG. 5A for an implementation in which the fast oscillator output signal cycles five times faster than the slow oscillator signal. Coarse counter 220 (FIG. 2A) will increment a single coarse quantizer integer step over which fine counter 225 (FIG. 2A) will count five times. Since the slow and fast oscillator output signals are perfectly combined with knowledge of their accurate periods, the resulting output of TDC 110 (designated as the sum of the coarse and fine quantizer) is linear over an input range of 0 to 20.

Figure 5B:
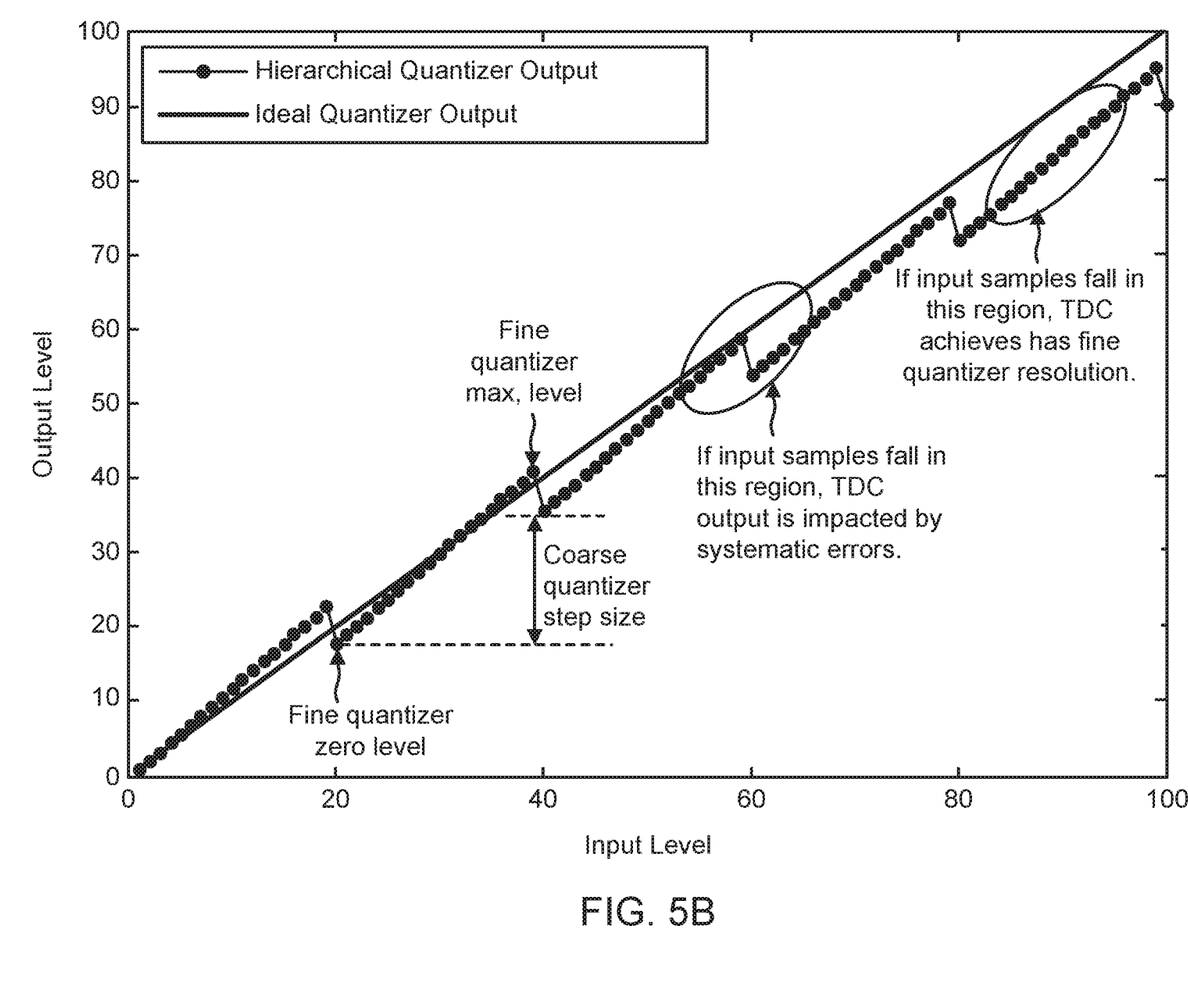
FIG. 5B is a graph of a real-world TDC output as a function of the TDC input.

But due to systematic errors and non-idealities, such a linear relationship between the input and output of TDC 110 is difficult to achieve. For example, a non-linear relationship between the input and output is shown in FIG. 5B for an implementation in which the fast oscillator output signal ideally has a period that is exactly $1/20^{th}$ of the period for the slow oscillator output signal. But due to the non-idealities, the periods for slow oscillator 205 and fast oscillator 210 obtained after calibration have finite errors as compared to their ideal values. In one case commonly encountered, starting from the input level of zero, the output of TDC 110 (designated as the Hierarchical Quantizer Output in FIG. 5B) will then progressively exceed the desired value at the end of each coarse quantizer increment (the fine counter having counted 20 times). The output of TDC 110 will thus have a large discontinuity every time the coarse quantizer increments, which corresponds to the beginning of each successive cycle of the slow oscillator output signal. Should the time difference to be measured result in a TDC output over such discontinuities, the TDC measurement is impacted by systematic errors such as highlighted in FIG. 5B for an input level of 60. In contrast, the desired linear relationship between the input and output is preserved if the input to be measured occurs in the middle of a coarse quantizer increment such as highlighted in FIG. 5B for the input range of approximately 85 through 95.

Figure 6:
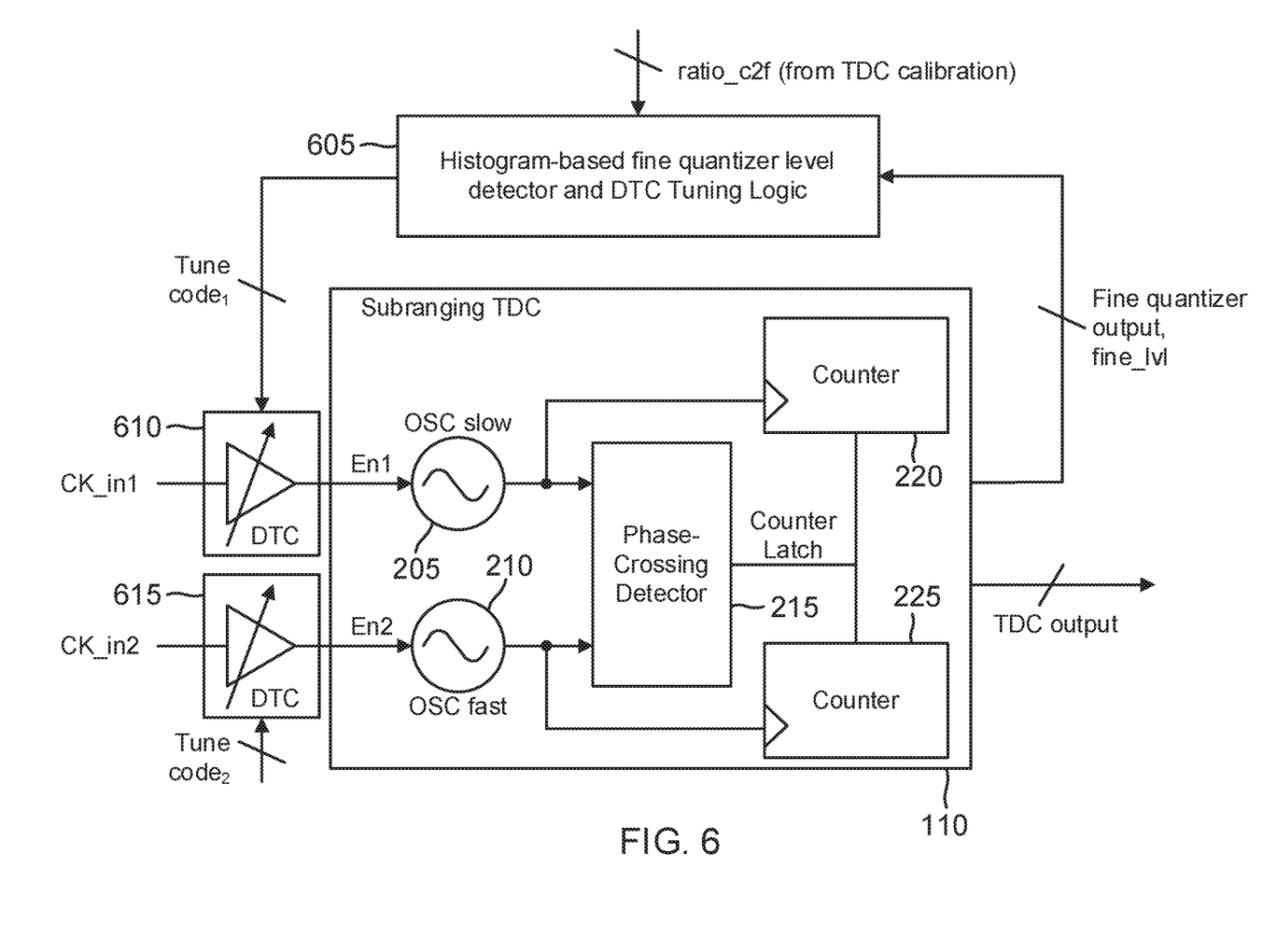
FIG. 6 is a circuit diagram of a TDC including a tunable digital-to-time converter (DTC) for improving the linearity in accordance with an aspect of the disclosure.

To avoid the discontinuities in the desired linear relationship between the input and output of TDC 110, TDC 110 may be configured as shown in FIG. 6. Slow oscillator 205, fast oscillator 210, phase detector 215, coarse counter 220, and fine counter 225 function as discussed with regard to FIGS. 2A and 3. But the selected clock edge (designated as CK_in1) that triggers slow oscillator 205 is selectively delayed in a delay circuit that may also be designated as a digital-to-time converter (DTC) 610. A histogram-based fine quantizer level detector and DTC tuning logic circuit 605 tunes DTC 610 using a first tuning code (Tune Code$_1$) based upon the fine quantizer output from fine quantizer (counter) 225 and also the ratio (ratio_c2f) between the fine quantizer step size and the coarse quantizer step size. This ratio is known from the calibration of slow oscillator 205 and fast oscillator 210 discussed previously. The maximum fine quantizer value or output equals the ratio ratio_c2f. The desirable region for the TDC input is thus when fine quantizer 225 counts to approximately one-half of ratio_c2f. Referring again to FIG. 5B, such a fine quantizer level results in an input-output relationship for TDC 110 that avoids the discontinuous regions.

As implied by the name, histogram-based fine quantizer level detector and DTC tuning logic circuit 605 observes the output of TDC 110 over a series of measurements such that the resulting histogram reveals whether the fine quantizer outputs for TDC 110 are occurring in the desired ratio_c2f/2 range for the corresponding coarse quantizer interval. For example, the fine quantizer range over a coarse quantizer interval may be divided into 3 regions: a beginning interval ranging from 0 to 0.3*ratio_c2f, a central interval ranging from 0.3*ratio_c2f to 0.7*ratio_c2f, and a final interval ranging from 0.7*ratio_c2f to ratio_c2f. It will be appreciated that each coarse quantizer increment or count may be divided into such fine quantizer intervals. Moreover, note that the boundary values for the fine quantizer intervals may be varied from the example just given. In addition, the number of such fine quantizer intervals may be greater than 3 in some implementations. Regardless of the exact boundaries between the fine quantizer intervals in each coarse quantizer increment, there will be a central interval (or intervals) that defines the desirable values for the fine quantizer level.

Figure 7:
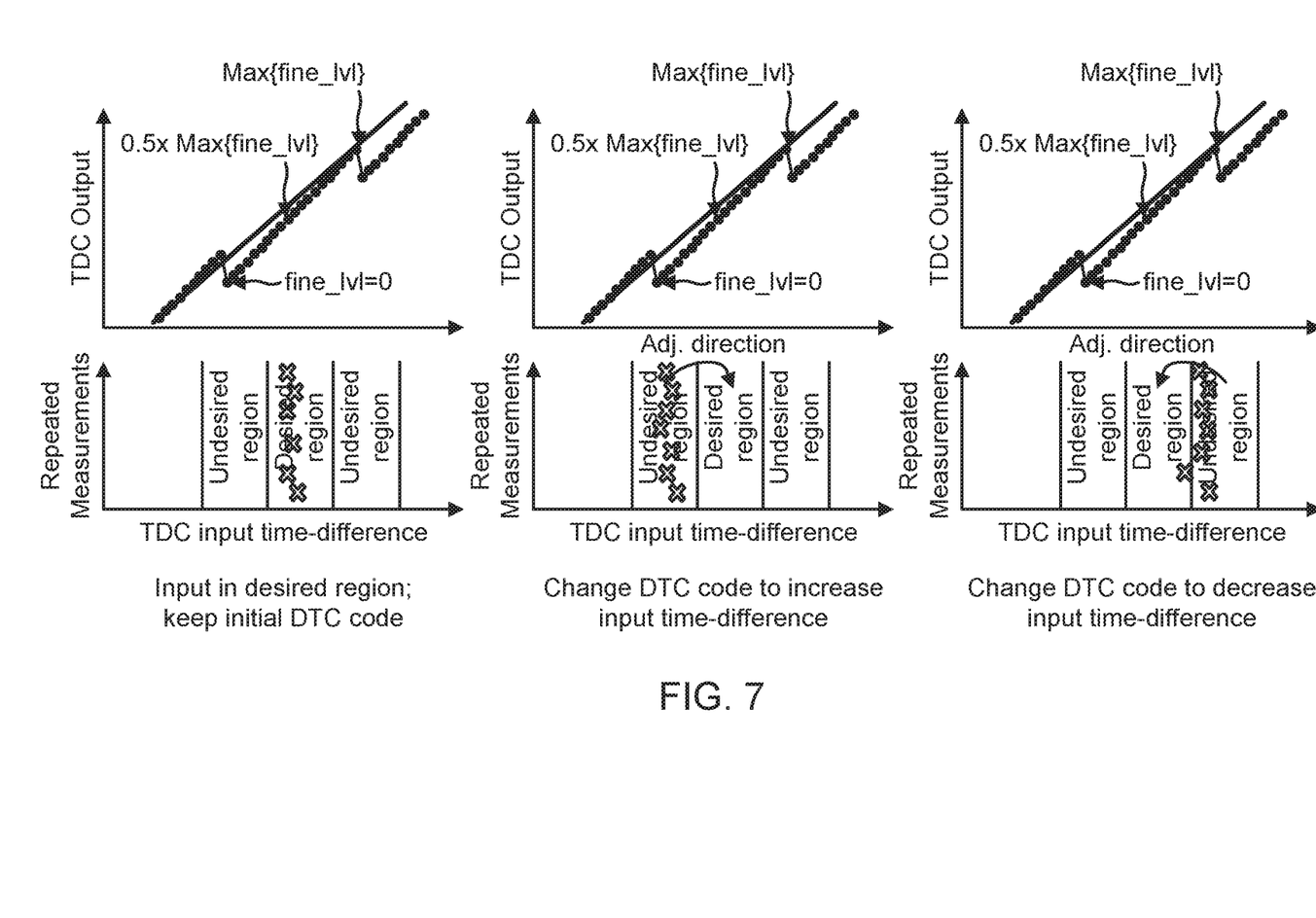
FIG. 7 illustrates three example histograms recorded by the TDC of FIG. 6.

Some representative fine quantizer intervals for a coarse quantizer increment are shown in FIG. 7 for three histograms of the fine quantizer count. In each histogram, the beginning and final intervals for a coarse quantizer increment are designated as undesired regions whereas the central interval for the same coarse quantizer increment is designated as the desired region. Each histogram is obtained from a series of repeated clock measurements. In a first histogram 700, the fine quantizer counts all occur in the desired region. There would be no reason to tune DTC 610 of FIG. 6 given such a histogram result because the output of TDC 110 is avoiding the discontinuities in its input-output relationship as also illustrated in FIG. 7.

A histogram 705 for the fine quantizer count results in all of the counts being in the initial undesired region. In response to such a histogram result, histogram-based fine quantizer level detector and DTC tuning logic circuit 605 may adjust the first tuning code so that DTC 610 adjusts delays of the first clock edge sufficiently so that a subsequent histogram measurement occurs with the fine quantizer counts landing in the desired region. Such an increase in time-difference at TDC input is appropriate to shift the fine quantizer counts from the initial undesirable range into the desirable range. Conversely, a histogram 710 results in the fine quantizer counts occurring in the final undesirable range such that histogram-based fine quantizer level detector and DTC tuning logic circuit 605 may adjust the first tuning code so that DTC 610 implements a reduced time-difference at TDC input. This reduction moves the resulting fine quantizer counts into the desired region. Referring again to FIG. 6, note that histogram-based fine quantizer level detector and DTC tuning logic circuit 605 may also tune a DTC 615 for adaptively delaying the second clock edge (designated as CK_in2) through a second tuning signal Tune code$_2$. Such additional tuning is optional.

Figure 8:
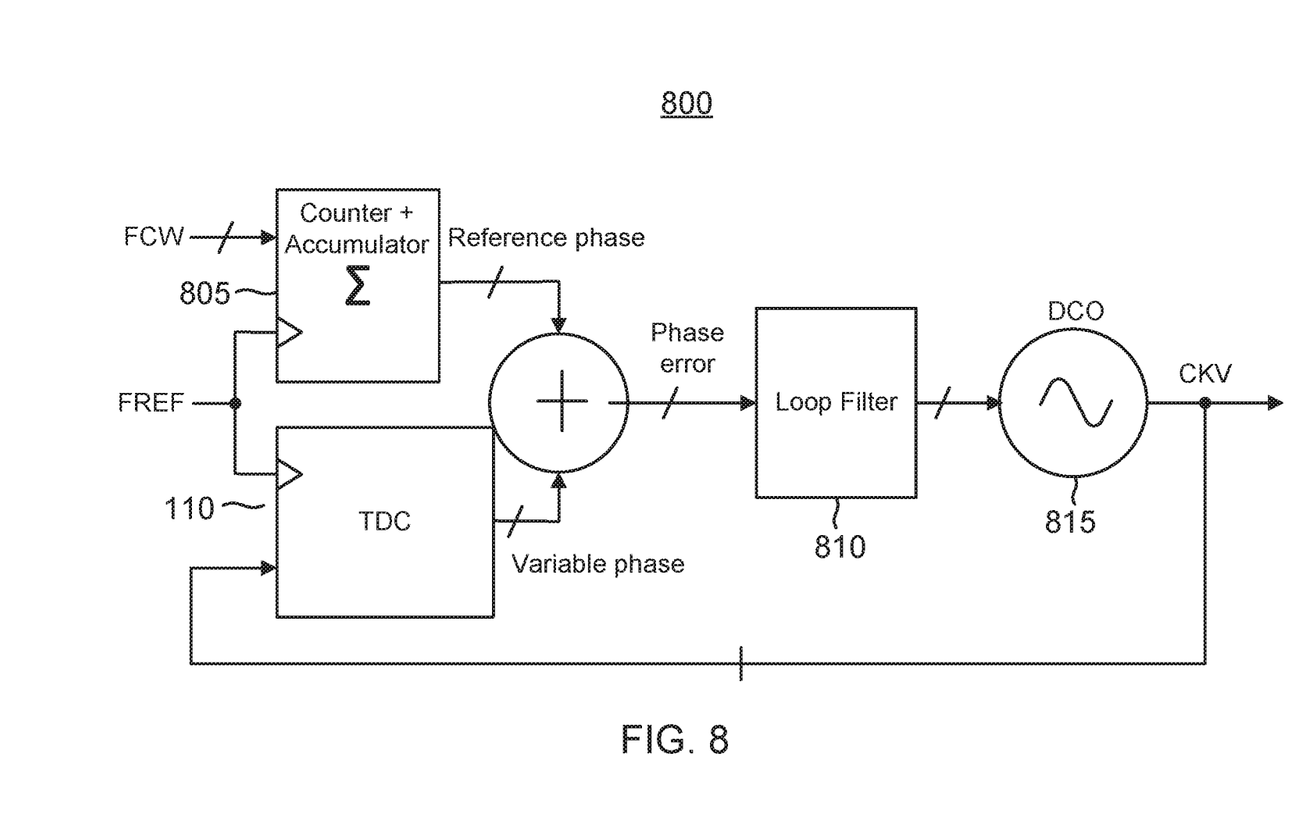
FIG. 8 is a block diagram of an all-digital phase-locked loop (PLL) including a TDC in accordance with an aspect of the disclosure.

Although TDC 110 has been discussed herein with regard to a clock measurement application, it will be appreciated that the increased resolution and wide input range for TDC 110 may be advantageously exploited in other circuits demanding such wide range and accurate time-to-digital measurement. For example, a digital phase-locked loop 800 as shown in FIG. 8 may include TDC 110 to compare an output clock signal CKV to a reference clock signal FREF to provide a variable phase output that is a digital word representing the phase difference between corresponding edges of the output clock signal CKV and the reference clock signal. An accumulator 805 produces a reference phase responsive to a frequency control word (FCW) and the reference clock signal. A loop filter 810 filters a phase error that equals the difference between the reference phase and the variable phase to produce a digital control word that controls the oscillation frequency of a digitally-controlled oscillator (DCO) 815 so as to control the frequency for output clock signal CKV. The DTC adjustment for TDC 110 in digital PLL 800 works well since typical jitter is much less that the coarse quantizer increment. Occasional outputs of TDC 110 that are affected by systematic error are filtered out by loop filter 800. The phase detection offset due to the DTC adjustment discussed with regard to FIGS. 6 and 7 is compensated by the loop feedback in digital PLL 800 once lock is obtained due to the resulting adjustment of the relative phase between the reference clock signal and a DCO clock signal (not illustrated). Since digital PLL 800 needs no reliance on oversampling and noise shaping its bandwidth is advantageously high so as to help filter DCO noise and promotes fast settling and tracking.

Those of ordinary skill will that appreciate that numerous modifications and applications may be made to the subranging TDC discussed herein. It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A time-to-digital converter for measuring a time between a first clock edge and a second clock edge, comprising:
    a slow oscillator configured to oscillate a slow oscillator output signal responsive to the first clock edge;
    a coarse counter configured to count a coarse count responsive to cycles of the slow oscillator output signal;
    a fast oscillator configured to oscillate a fast oscillator output signal responsive to the second clock edge, wherein the fast oscillator is a first ring oscillator, and wherein the slow oscillator is a second ring oscillator;
    a fine counter configured to count a fine count responsive to cycles of the fast oscillator output signal, wherein a frequency for the fast oscillator output signal is greater than a frequency for the slow oscillator output signal;
    a first current source coupled to an input of the slow oscillator and configured to selectively sink a first current; and
    a second current source coupled to an input of the fast oscillator and configured to selectively sink a second current.

2. The time-to-digital converter of claim 1, further comprising:
    a phase detector configured to latch the coarse counter responsive to a detection that a phase for the slow oscillator output signal is leading a phase for the fast oscillator output signal.

3. The time-to-digital converter of claim 2, wherein the phase detector is further configured to latch the fine counter responsive to the detection.

4. The time-to-digital converter of claim 1, wherein the first ring oscillator comprises a first set of at least three inverters, and wherein the second ring oscillator comprises a second set of at least three inverters.

5. The time-to-digital converter of claim 1, wherein the first current source is further configured to sink the first current prior to the first clock edge.

6. The time-to-digital converter of claim 1, wherein the first current is a replica of a current drawn by the slow oscillator.

7. The time-to-digital converter of claim 1, wherein the second current source is further configured to sink the second current prior to the first second clock edge.

8. The time-to-digital converter of claim 1, wherein the second current is a replica of a current drawn by the fast oscillator.

9. The time-to-digital converter of claim 1, further comprising a tuning logic circuit configured to tune a first delay circuit for delaying a first clock signal having the first clock edge responsive to a series of clock measurements.

10. A method, comprising:
    sinking a first current through a first current source prior to a first clock edge;
    shutting off the first current source responsive to the first clock edge;
    oscillating a slow oscillator output signal responsive to the first clock edge;
    sinking a second current through a second current source prior to a second clock edge following the first clock edge;
    shutting off the second current source responsive to the second clock edge;
    oscillating a fast oscillator output signal responsive to the second clock edge, wherein a frequency for the fast oscillator output signal is greater than a frequency for the slow oscillator output signal;
    counting cycles of the slow oscillator output signal to count a coarse count;
    counting cycles of the fast oscillator output signal to count a fine count; and
    measuring a delay between first clock edge and the second clock edge responsive to a function of the coarse count and the fine count to form a measurement of the delay.

11. The method of claim 10, further comprising:
    measuring a period jitter for a clock signal having the first clock edge and the second clock edge responsive to the measurement of the delay.

12. The method of claim 10, further comprising:
    measuring a K-cycle period jitter for a clock signal having the first clock edge and the second clock edge responsive to the measurement of the delay.

13. The method of claim 10, wherein the first clock edge is a rising edge for a clock signal and the second clock edge is a falling edge for the clock signal, the method further comprising measuring a duty cycle for the clock signal responsive to the measurement of the delay.

14. The method of claim 10, wherein the first clock edge is a clock edge for a reference clock signal, and wherein the second clock edge is a clock edge for a phase-locked loop (PLL) clock signal, the method further comprising measuring a time internal error for the PLL clock signal responsive to the measurement of the delay.

15. The method of claim 10, wherein the first clock edge is an edge for an early clock signal and wherein the second clock edge is an edge for a late clock signal, the method further comprising measuring a clock skew between the early clock signal and the late clock signal responsive to the measurement of the delay.

16. The method of claim 10, wherein the first current is a replica of a current drawn by the slow oscillator.

17. The method of claim 10, wherein the second current is a replica of a current drawn by the fast oscillator.

* * * * *